US004001717B2

United States Statutory Invention Registration [19]

[11] Reg. Number: H1717

[45] Published: Apr. 7, 1998

Stoudt et al.

[54] BISTABLE PHOTOCONDUCTIVE SWITCHES PARTICULARLY SUITED FOR FREQUENCY-AGILE, RADIO-FREQUENCY SOURCES

[75] Inventors: David C. Stoudt, King George, Va.; Michael A. Richardson, Louisville, Colo.

[73] Assignee: The United States of America as represented by the Secretary of the Navy, Washington, D.C.

[21] Appl. No.: 558,998

[22] Filed: Nov. 16, 1995

[51] Int. Cl.[6] ..... H01L 27/14; H01L 31/00

[52] U.S. Cl. ..... 257/431; 250/214.1

[58] Field of Search ..... 257/431

*Primary Examiner*—Bernarr E. Gregory
*Attorney, Agent, or Firm*—James B. Bechtel, Esq.

[57] ABSTRACT

A photoconductive switching device is disclosed that has an enhanced speed of response so that its closed (low) and open (high) resistive states are obtained in response to optical illumination in the less than nanosecond regime. The enhanced speed of response is achieved by neutron irradiation of a material preferably comprising GaAs:Si:Cu. An application of the improved photoconductive switching devices is disclosed which allows the realization of a high-power, frequency-agile RF source topology.

19 Claims, 11 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

BISTABLE PHOTOCONDUCTIVE SWITCHES PARTICULARLY SUITED FOR FREQUENCY-AGILE, RADIO-FREQUENCY SOURCES

STATEMENT OF GOVERNMENT INTEREST

The invention described herein was made by employees of the United States Government and may be manufactured and used by or for the Government for governmental purposes without the payment of any royalties thereon or therefor.

FIELD OF THE INVENTION

This invention relates generally to semiconductors and radio frequency (RF) sources, and relates specifically to both a fabrication process for making copper-compensated, silicon-doped, gallium arsenide (GaAs) bistable, photoconductive switches and circuit arrangements thereof. These switches are particularly suited to provide high-speed, high-power, frequency-agile RF sources.

BACKGROUND OF THE INVENTION

In recent years there has been considerable interest in the development of high-speed, high-power photoconductive switches for use in direct dc, or quasi-dc, to RF conversion thereof. The applications for this type of technology are primarily in the area of ultra-wide-band (UWB) radar, impulse radar, biological-effects testing, and high-speed diagnostic equipment. These applications require that the switching speeds be as fast as possible so that the generated electrical pulses contain the highest possible frequency components.

A recently introduced photoconductive switch, which is called the bistable (or bulk) optically controlled semiconductor switch (BOSS), (herein termed a BOSS switch) is disclosed in U.S. Pat. No. 4,825,061 ('061) of Schoenbach, et al, herein incorporated by reference. The operation of the BOSS switch disclosed in the '061 patent relies on persistent photoconductivity, which can be considered a gain mode, followed by photo-induced quenching to provide both BOSS switch closing and opening, respectively. A semi-insulating GaAs material is used in this BOSS switch and is manufactured by controlled electrical compensation of silicon-doped GaAs with copper (GaAs:Si:Cu). The process by which the GaAs:Si:Cu material may be manufactured is disclosed in U.S. Pat. No. 5,374,589 ('589) of Roush, et al teaching a thermally diffused copper process, herein incorporated by reference. We have determined that the BOSS switches formed of this copper-compensated, silicon-doped material (GaAs:Si:Cu) described in the '061 patent and manufactured by the thermal diffusing process of the '589 patent suffer a drawback in their inability to switch to their open or high resistance state in response to a subnanosecond light pulse having an operating wavelength in the 2-micron regime. This drawback limits the radio-frequency range for the applications of BOSS switches.

It is therefore an important object of the present invention to provide BOSS switches that may be switched into their open, high resistance state in response to a subnanosecond light pulse.

SUMMARY OF THE INVENTION

The invention is directed to a method of enhancing the speed of response of a photoconductive switch, such as a BOSS switch so that it may be switched into its open or high resistance state in response to a subnanosecond light pulse. The invention is also directed to circuit arrangements provided by these improved BOSS switches.

The photoconductive switch has a predetermined recombination center density created by neutron irradiation and also has closed low-resistance and open high resistance states, wherein the open state is achieved within a time less than 1 nanosecond in response to a light pulse. The photoconductive switch is preferably comprised of GaAs:Si:Cu, wherein Cu forms a deep acceptor level $Cu_B$ in said GaAs at an energy level of about 0.44 eV above a valence band.

Accordingly, it is a primary object of the present invention to provide a photoconductive switch that is responsive to a light pulse in the subnanosecond regime so as to switch the device into its open state possessing a high electrical resistance.

It is a further object of the present invention to subject photoconductive switching device to neutron irradiation so as to increase the density of its recombination centers to enhance the speed of its response, especially the speed of response of the photoconductive switching device to a light signal in the subnanosecond regime so as to switch the photoconductive device into its high electrical resistant state.

It is a further object of the present invention to arrange one or more photoconductive switching devices, each having an improved speed of response, into a generator particularly suited for RF application and which may be configured onto a microstrip arrangement.

Further still, it is an object of the present invention to provide for a pulse-switch-out (PSO) generator capable of switching relatively high positive and negative voltage potentials.

Other objects, advantages and novel features of the invention will become apparent from the following detailed description when considered in conjunction the accompanying drawings herein.

DETAILED DESCRIPTION OF THE PREFERRED EMBODIMENTS

In general, the present invention relates to a photoconductive switching device, such as a semiconductor switch commonly referred to as a BOSS switch disclosed in both the previously mentioned U.S. Pat. Nos. 4,825,061 ('061) and 5,374,589 ('589). However, unlike the BOSS switch disclosed in the '061 and '589 patents, the photoconductive switch of the present invention obtains its closed, low-resistance and open, high electrical resistance state, each within a time less than 1 nanosecond, in response to the application of a light pulse, such as a laser beam. The achievement of this less than 1 nanosecond response is achieved by neutron-irradiation of BOSS switches which increases the density of recombination centers in the material GaAs:Si:Cu, preferably used for the photoconductive switch of the present invention. The various energy levels of interest within the bandgap of GaAs:Si:Cu at 25° C. is shown in FIG. 1 and has the parameters given in Table 1:

TABLE 1

| REFERENCE NUMBER/LETTER | GENERAL DEFINITION |
|---|---|
| 12 (Ec) | Conduction Band |
| 14 ($E_{si}$) | Silicon Shallow Donor having a typical value of 5.8 meV below conduction band 12 |
| 16 ($E_F$) | Fermi Level |
| 18 ($E_{Cu_B}$) | Electron Level of $Cu_B$ Deep Acceptor having a typical value of 0.44 eV above valence band 20 |
| 20 ($E_v$) | Valence Band |
| $Cu_B$ | Copper Dominant Deep Acceptor Level |
| $Cu_A$ | Copper Dominant Deep Acceptor Level having a typical value of 0.14 eV above valence band 20 |
| EL2 | Deep Donor Level Native to GaAs and having a typical value of 0.83 eV below conduction band 12 |
| RC | Recombination Center having an approximate value of 0.67 eV below conduction band 12 |
| Bandgap | Bandgap having a typical value of 1.42 eV as measured between the conduction band 12 and valence band 20 and commonly referred to as hv |

Figure 1:
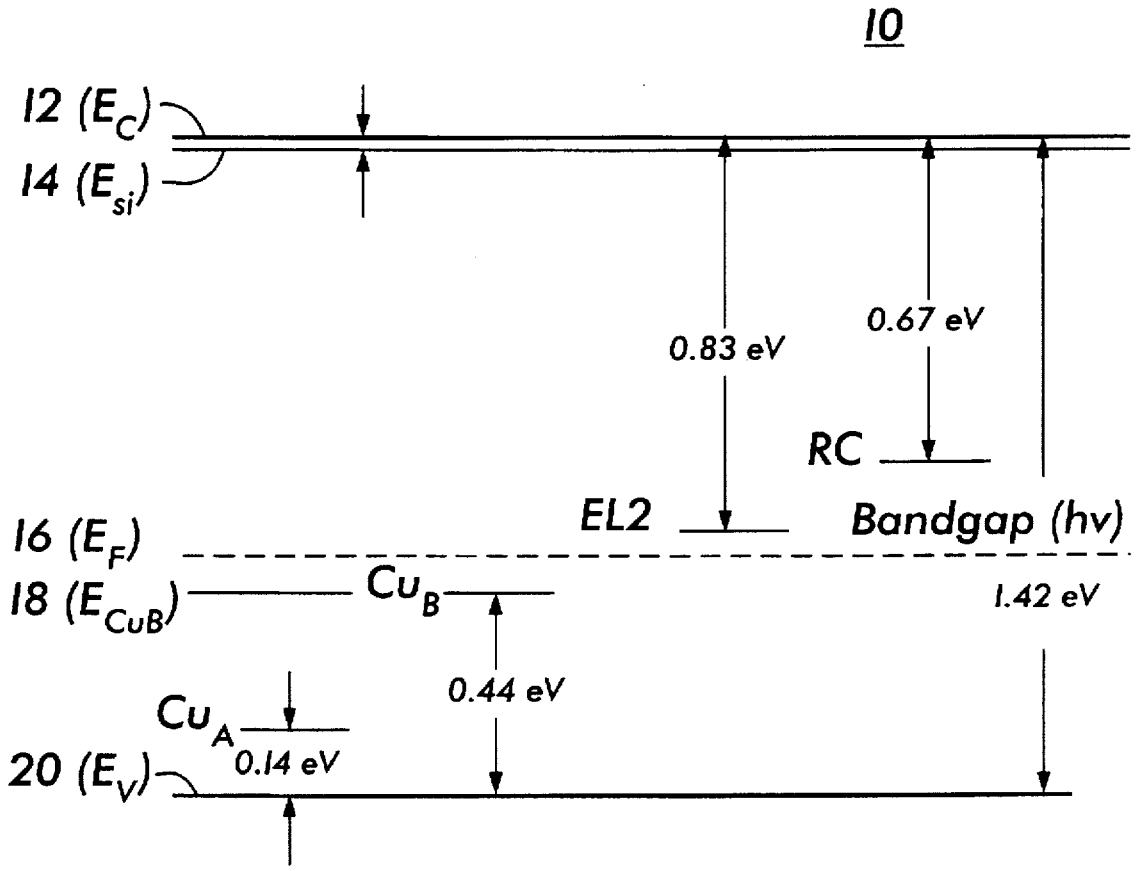
FIG. 1 is an energy-level diagram showing the dominant impurity levels of a semiconductor material preferably used for the photoconductive switch of the present invention.

The location of the recombination center RC, to be further described hereinafter, shown in FIG. 1 is an approximate, not precise, value. The copper, Cu, used in the material GaAs:Si:Cu forms two dominant deep acceptor levels in GaAs, at 0.14 eV ($Cu_A$) and 0.44 eV ($Cu_B$) both above the valence band 20. The $Cu_B$ level is the copper level of primary interest of the photoconductive switching device of the present invention and is interchangeably referred to herein as "$Cu_B$ center."

The photo-ionization cross section of holes ($10^{-16}$ $cm^2$) and of electrons ($10^{-17}$ $cm^2$) for the $Cu_B$ level in GaAs, which are of importance to the present invention, were measured by Kullendorf, et al, as described in the technical article "Copper-Related Deep Level Defects in III–V Semiconductors," published in *J.Appl. Phys.*, Vol. 54, pp. 3203–3212, 1983 and herein incorporated by reference. In addition, the capture cross sections for holes and electrons in the $Cu_B$ center, also important to the present invention, are $3\times10^{-14}$ $cm^2$ and $8\times10^{-21}$ $cm^2$, respectively, as described by D. V. Lang and R. A. Logan, in the technical article "A Study of Deep Levels in GaAs by Capacitance Spectroscopy," published in the *J. Electronic Materials*, Vol. 4, pp. 1053–1066, 1975, and also herein incorporated by reference. The large ratio of the hole to electron capture cross sections make the $Cu_B$ center a very strong hole trap. When the proper amount of copper is diffused into the GaAs:Si material to result in a semi-insulating behavior, as is the case in the present invention, the electron Fermi level 16 of FIG. 1 is above the $Cu_B$ level. Therefore, the $Cu_B$ center is mostly full of electrons under the conditions of thermodynamic equilibrium. This fact, as well as the large ratio of capture cross sections for holes and electrons in the $Cu_B$ center, is of importance to the present invention. The operation of the present invention may be further described with reference to FIG. 2 composed of FIGS. 2(A), (B), (C), (D), (E) and (F).

Figure 2A:
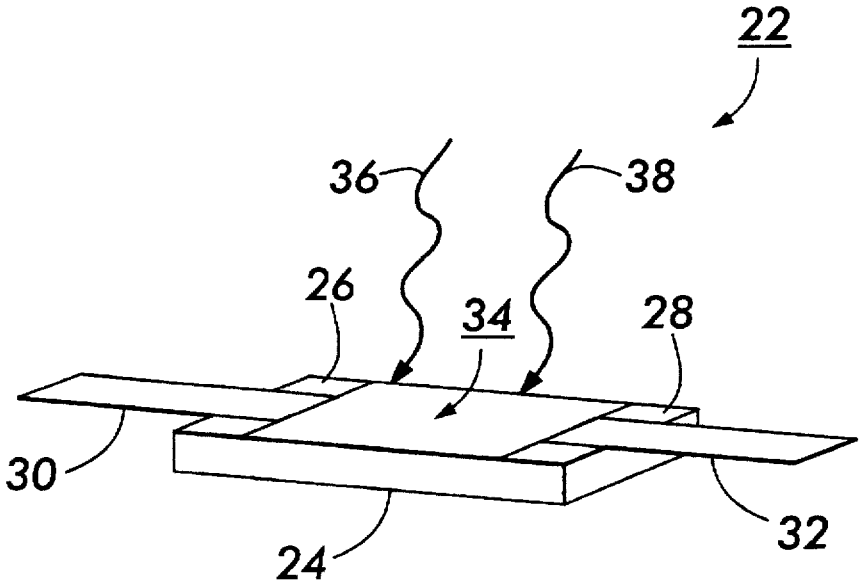
FIG. 2 is composed of FIGS. 2(A), (B), (C), (D), (E), and (F) and illustrate the overall operation of the photoconductive switch of the present invention.

One possible photoconductive switch geometry, shown in FIG. 2(A), is sometimes referred to as a lateral switch and is generally indicated with the reference number 22. The photoconductive switch 22 comprises a bulk piece 24 of semi-insulating material, sometimes referred to as substrate, with two electrical contacts 26 and 28 operatively connected to the substrate 24, in a manner known in the art, and herein termed "electrical-contact gaps." The electrical-contact gaps 26 and 28 are preferably located at opposite ends of the substrate 24 and each has a length in the range from about less than about 1 micrometer to greater than about 1 centimeter. It is further preferred that the electrical-contact gaps 26 and 28 be located at opposite ends of the same surface of the substrate 24. The electrical-contact gaps 26 and 28 are operatively connected to electrically conductive elements 30 and 32, respectively, wherein conductive element 30 may be arranged to serve as an input port and receive an input signal (not shown) and conductive element 32 may be arranged to serve as an output port and provide an output signal from the photoconductive switch 22.

The photoconductive switch 22 has a third port 34 located between the electrical-contact gaps 26 and 28 and arranged to receive optical illumination. The photoconductive switch 22 may serve as a BOSS switch described in the previously incorporated by reference patents '061 and '589. The optical illumination impinging on the BOSS switch 22 may comprise first and second light beams 36 and 38 respectively having first and second wavelengths, with the second wavelength being longer than the first wavelength. The first and second wavelengths may respectively have typical values of about 1 and 2 micrometers, respectively. The first and second light beams are preferably laser beams supplied from a Nd:YAG laser fitted with an optical parametric generator (OPG). The laser beams 36 and 38 may be interchangeably referred to herein as turn-on, turn-off lasers.

Figure 2B:
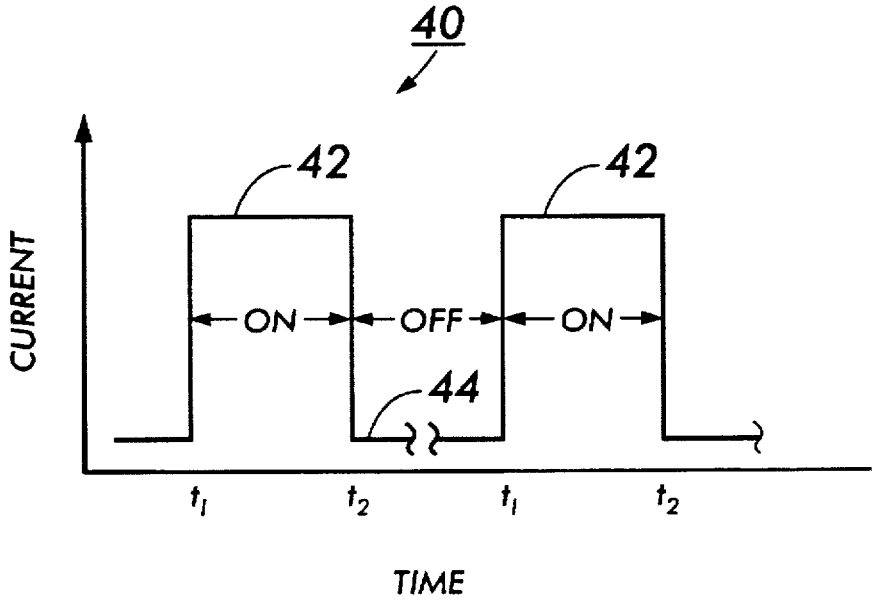

FIGS. 2(B), (C), (D), (E), and (F), respectively illustrate (a) the resulting current delivered to a load during the switching cycle of the BOSS switch 22, (b) the initial high-resistive state of material (GaAs:Si:Cu) prior to the first laser beam 36, (c) the optical excitation of electrons from the $Cu_B$ center to the conduction band 12, (d) the slow decay of electrons during the on state of the BOSS switch 22, and (e) the fast photo-induced quenching of the photoconductivity of the BOSS switch 22.

As seen in FIG. 2(B), the current that is permitted to flow through external circuit (not shown) has a waveform 40 comprising an on-state (42) and an off-state (44). The on-state 42 has a period determined by the difference between times $t_1$ and $t_2$, whereas the off-state 44 is determined by the selected duty cycle of the BOSS switch 22.

Figure 2C:
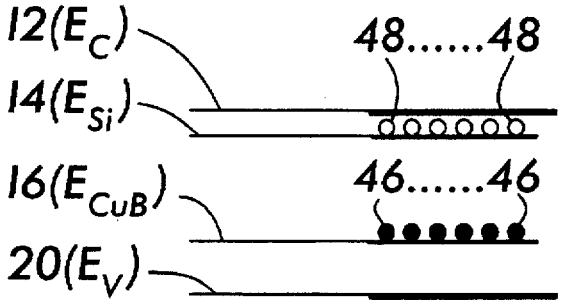
Figure 2D:
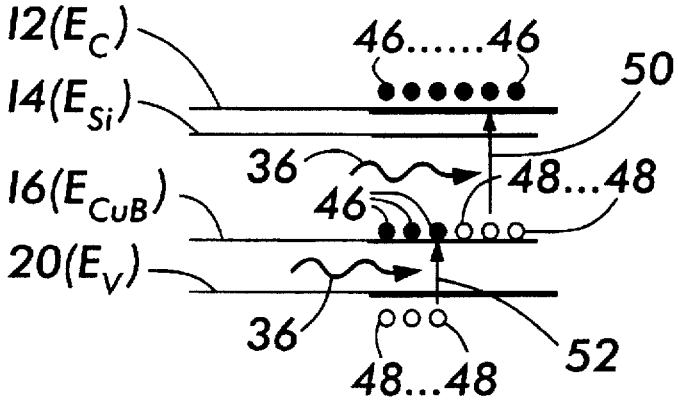

As seen in FIG. 2(C), for ideal switching conditions for the BOSS switch 22 all thermally ionized electrons 46 from the silicon level 14($E_{si}$) are trapped in the $Cu_B$ center illustrated as being at electron level 16 ($E_{CuB}$). Further, as seen in FIG. 2(C) holes 48 are located between the silicon level 14 and the conduction band 12. The ideal conditions of FIG. 2(C) represent that the trapping of the electrons in the $Cu_B$ center results in an electrically compensated, high-resistivity material, and the state of the BOSS switch 22 when voltage (to be described) is first applied. In this condition, the BOSS switch 22 may be illuminated with the laser beam 36 that supplies photon energy sufficient, as illustrated in FIG. 2(D), to elevate, as indicated by directional arrow 50, the electrons 46 from the $Cu_B$ center to the conduction band 12. The supply of photon energy is realized by the laser beam 36 having a typical fundamental wavelength of a Nd:YAG laser, $\lambda$=1.06 micrometer.

Figure 2E:
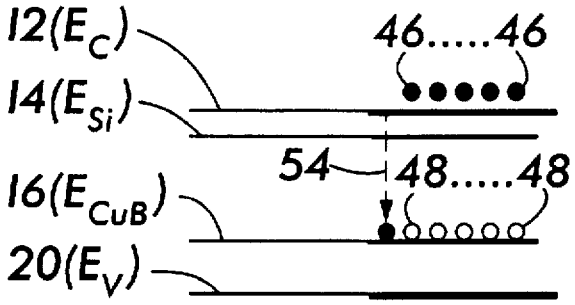
Figure 2F:
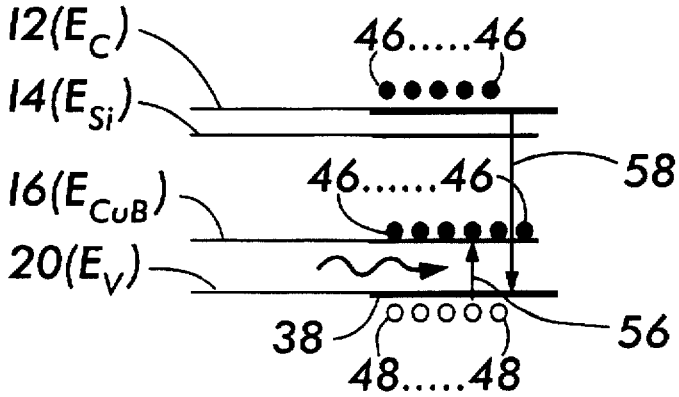

As further seen in FIG. 2(D), at the same time electrons 46 are elevated from the $Cu_B$ center, holes 48 are generated in the valence band 20 through photonionization of empty $Cu_B$ levels. As the laser pulse 36 is terminated, there is a period of fast electron-hole recombination, as indicated by directional arrow 52, through the recombination center (not depicted in FIG. 2.). However, due to the large cross-section of $Cu_B$ for hole trapping, a sufficient density of holes are re-trapped to allow a large free-electron density to remain in the conduction band. Therefore, current is permitted to flow through the external circuit as previously discussed with reference to FIG. 2(B) and as shown by on-state 42 thereof. Because the electron capture cross-section of $Cu_B$ is much smaller than the hole capture cross-section of $Cu_B$, the electrons in the conduction band 12 will remain for relatively long periods of time, as generally illustrated in FIG. 2(E) by phantom directional arrow 54, after the first laser beam 36 is terminated. The long lifetime of electrons in the conduction band 12 makes GaAs:Si:Cu a high-gain photoconductor material because current will flow to an external circuit for a relatively long time after the turn-on laser beam 36 is terminated.

The current through the BOSS switch 22 can now be terminated by illuminating the GaAs crystal with photons of energy that is less than the $Cu_B$-to-conduction-band transition (approximately 1.42 eV–0.44 eV=0.98 eV), but greater than the valence-band-to-$Cu_B$ transition (0.44 eV<hv<0.9 SeV). The second laser beam 38 may supply this illumination and may have a typical wavelength of a wavelength-doubled Nd:YAG laser, $\lambda$=2.13 micrometers. These photons will elevate, as indicated by directional arrow 56, electrons 46 back into the $Cu_B$ level, leaving behind holes 48 in the valence band 20 which can then recombine, as indicated by directional arrow 58 with the free electrons in the conduction band 16, thus leading to the opening of the BOSS switch 22 (see FIG. 2(F)) on a nanosecond time scale. In a desired case, the second laser beam 38 would reset the GaAs:Si:Cu material 24 back to its initial condition (see FIG. 2(C)) prior to the first laser beam 36. The BOSS switch 22 may be operated at high-repetition rates and also to switch relatively high power levels.

METHOD OF FORMING THE PHOTOCONDUCTIVE SWITCH OF THE PRESENT INVENTION

As discussed in the "Background" section, we have determined that the GaAs:Si:Cu material produced by a thermal diffusion process, without the benefits of the present invention, contains an insufficient number of recombination centers to allow a photoconductive switch, such as a BOSS switch, to open in the subnanosecond regime. Therefore, in accordance with the practice of the present invention we provide the means to create a higher density of recombination centers in the GaAs crystal to allow for BOSS switch 22 to open in the subnanosecond regime. Fast-neutron irradiation is selected to introduce this higher density of recombination centers, each possessing a near-mid-bandgap energy level such as 0.67 eV illustrated in FIG. 1. It is preferred that the density of recombination centers be within the range from about $5\times10^{15}$ $cm^{-3}$ to about $5\times10^{16}$ $cm^{-3}$.

The effects of neutron irradiation on semiconducting materials have been studied for many years. A recent effort has concentrated on the reduction of the minority-carrier lifetime in GaAs through fast-neutron irradiation as disclosed by C. L. Wang, et al, in the technical article "Neutron-Treated, Ultrafast, Photoconductor Detectors," published in *Appl. Phys. Lett.*, Vol. 54, pp. 1451–1453, 1989, and herein incorporated by reference. This work by Wang et al indicated that the crystal damage created by neutron irradiation could be used for the purpose of recombination center enhancement in a BOSS switch that is based on a GaAs-:Si:Cu material. However, unlike the present invention, the work of Wang et al is silent on any teaching of any intensity neutron irradiation, within any desired range, needed to improve the response time of the BOSS switch.

The unit for describing the intensity of neutron radiation is flux in units of neutrons/$cm^2$-s. The time integral of the flux, called the fluence, has the units of neutrons/$cm^2$ and is designated by the symbol $\Phi$. Fluence is the common term used in radiation effects field to describe neutron exposure. Another important characteristic of radiation is the energy spectrum. The neutron source used in our work was Sandia National Laboratory's SPR-III bare core reactor. Special precautions were taken in our work to insure that the sample temperature, that is the temperature of the BOSS switch 22 of our invention receiving neutron irradiation, did not rise about 100° C. during the time that the samples were being exposed. The energy spectrum of this source used to provide neutron irradiation of our samples, is peaked at about 1 MeV. A boron shield was used during the irradiations or our photoconductive switch to absorb thermal neutrons below 10 keV. Accordingly, it is preferred that the energy spectrum for neutron irradiation, used in the practice of our invention, range from 10 keV to 1 MeV.

Our BOSS switch 22 was irradiated with energetic neutrons following the thermal diffusion of copper into the GaAs material, more fully described in the '589 patent, and both before and after the electrical-contact gaps 26 and 28 (see FIG. 2(A)) were fabricated onto the GaAs substrate 24. Thus far, many BOSS switches have been irradiated at multiple fluence levels and have been experimentally tested to determine the results of the irradiation. The neutron irradiation enhances the speed of response of the BOSS switches 22 as shown from our experimental testing to be more fully described hereinafter. Two samples (Sample A and Sample B) were experimentally tested in which Sample A received neutron irradiation at a relatively low fluence measured at $2.45\times10^{15}$ $cm^{-2}$, whereas Sample B received neutron irradiation at a relatively high fluence measured at $3.93\times10^{15}$ $cm^{-2}$. The dc I–V characteristics of the samples A and B indicated an increase in the switch resistance (open-state, see FIG. 2(F)) from about 3.2MΩ (measured prior to neutron irradiation) to about 55MΩ for the lower fluence irradiation, and an increase from about 4.3MΩ (measured prior to neutron irradiation) to about 273MΩ for the higher fluence irradiation.

SWITCHING APPLICATIONS OF THE PHOTOCONDUCTIVE SWITCH OF THE PRESENT INVENTION

The ability of a BOSS switch, not having the benefits of the present invention, preferably made from GaAs:Si:Cu, to close and open has been demonstrated at relatively high power levels on the several-nanosecond time scale by D. C. Stoudt, et al, as disclosed in the technical article "Characterization and Switching Study of an Optically Controlled GaAs switch," published *Proc. SPIE, Vol.* 1378, *Optically Activated Switching,* 1990, pp. 280–285; and again by D. C. Stoudt, et al, as described in the technical article, "Investigation of a Laser-Controlled, Copper-Doped GaAs Closing (low resistance state) and Opening (high resistance state) Switch for Pulsed Power Applications," published *Proc. 8th IEEE Pulsed Power Conf.,* San Diego, Calif. 1991, pp. 41–45, both of such technical articles being herein incorporated by reference. Recent experimental results have shown that the current through a BOSS switch could not be fully quenched (turned-off) by the application of a 140 ps full width at half magnitude (FWHM) 2.13 μm laser pulse as described by M. S. Mazzola et al, in the technical article "Subnanosecond Performance of the BOSS GaAs Opening Switch," published in *Proc. 20th Power Mod. Symp.,* Myrtle Beach, S.C., 1992, pp. 266–270 and which is herein incorporated by reference. A numerical solution of the semiconductor rate equations for copper-doped GaAs showed that the primary cause for incomplete photo-quenching, on the subnanosecond time scale, such as described by M. S. Mazzola et al, was that the concentration of the recombination centers was too low. This numerical solution was disclosed by D. C. Stoudt, et al, in the technical article "Effects of 1 MeV Neutron Irradiation on the Operation of a Bistable Optically Controlled Semiconductor Switch (BOSS)," published in *IEEE Trans. Electron Dev.,* Vol. 41, pp. 913–919, 1994. Again, like the previously mentioned work of Wang et al, the extensive works of M. S. Mazzola et al and D. C. Stoudt et al are silent on any teaching related to the present invention of any neutron irradiation within any desired range needed to improve the response time of the BOSS switch to the subnanosecond regime.

The transition for placing the BOSS switch 22 conducting relatively high power levels into its high electrical resistance state is the result of a two-step process, with one step being controlled by the electron-hole recombination lifetime which is dominated by the concentration of mid-gap recombination centers in the bulk material. For example, the recombination centers located in the mid-region of the bandgap (hv) such as the recombination center RC of FIG. 1 having an energy level of approximately 0.67 eV and approximately located in the mid-region of the bandgap (hv) of FIG. 1.

A recombination center (RC) is considered to occur when the cross-sections for electron and hole capture are approximately equal. If there is an insufficient recombination center concentration, the holes that are generated by the light pulse, such as 2 μm laser pulse (second laser beam 38 of FIG. 2(A)) commonly applied to turn off the BOSS switch, are re-trapped in the copper centers, such as $Cu_B$, before the holes have an opportunity to recombine with electrons in the conduction band. This re-trapping disadvantageously results in the switch remaining closed after the termination of the second laser beam 38 of FIG. 2(F). The present invention eliminates this problem by neutron irradiation of the BOSS switch 22 to supply a sufficient number of recombination centers to prevent re-trapping of holes and allow BOSS switch 22 to sequence into its open (high resistant) state after the laser beam 38 is terminated.

One potential application for the BOSS technology having the benefits of the present invention is a wideband, frequency-agile source that can radiate the RF energy with a broadband antenna. For such an application, in order to maximize the radiative efficiency of the source, it is necessary to produce ac power which reduces the dc component of the waveform. This is important since the dc component cannot be radiated out of an antenna. The ability of the BOSS switch 22 of the present invention to open, as well as close, in the subnanosecond regime allows a unique type of RF source to be developed that is capable of generating repetitive high-power microwave cycles of varying duration, depending on the relative delay between the turn-on and turn-off laser pulses, such as laser beams 36 and 38 respectively, of FIG. 2(A).

Figure 3:
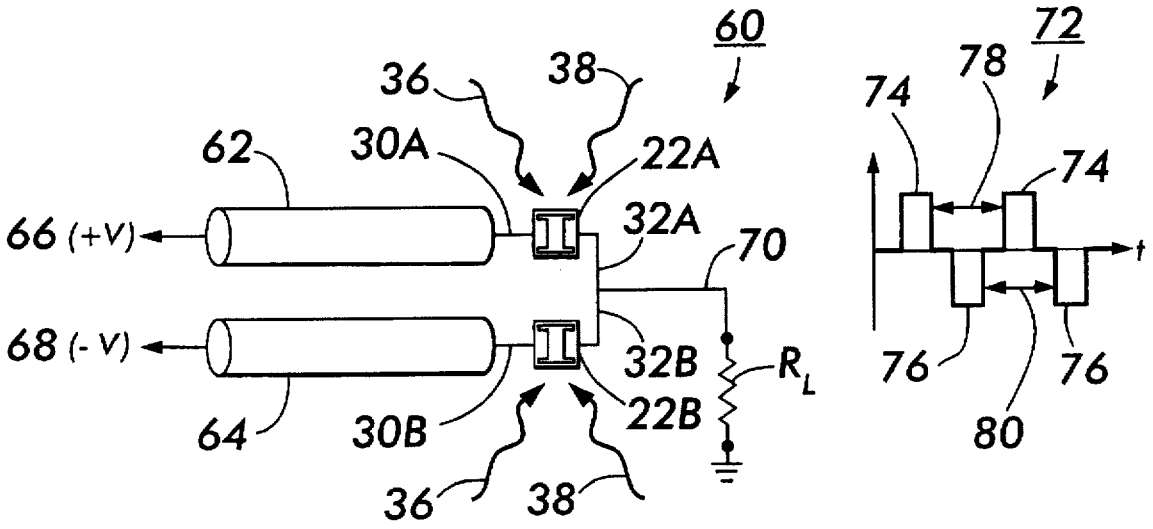
FIG. 3 is a schematic diagram of a pulse-switch-out (PSO) generator that utilizes two photoconductive switches of the present invention.

An RF source configuration that makes use of the benefits of the present invention and that is capable of generating ac power with real-time frequency agility (known in the art) is shown in FIG. 3 and is commonly called a pulse-switch-out (PSO) generator. The PSO generator 60 of FIG. 3 comprises a first BOSS switch 22A and a second BOSS switch 22B each having the energy levels, in particular, the recombination center RC illustrated in FIG. 1. The BOSS switches 22A and 22B have input connections 30A and 30B, respectively, and output connections 32A and 32B, respectively, previously described, in general, with reference to FIG. 2(A). The input connections 30A and 30B are respectively connected to one end of charged transmission lines 62 and 64 which have their other end respectively connected to a relatively high positive (+V) potential 66 and a relatively high negative (−V) potential 68. Both output connections 32A and 32B are preferably connected to one end of common transmission line 70 which has its other end connected to a load $R_L$ that may represent a broadband antenna. The operation, to be described, of the PSO generator 60 generates an output voltage 72 having positive half-cycles 74 and negative half-cycles 76 as shown in FIG. 3. The time between pulses 74 represents the time between closures of BOSS switch 22A and is indicated by dimensional line 78 and the time between pulses 76 represents the time between closures of BOSS switch 22B and is indicated by dimensional line 80. Positive (74) and negative (76) half-cycles, serves as RF pulses, are generated by first closing and then opening each BOSS switch 22A and 22B in succession. The frequency content in the generated RF pulses 74 and 76, as will be further described, can be adjusted by either varying the time between the closure of each BOSS switch 22A and 22B, or by varying the time between the closure of each BOSS switch 22A and 22B while keeping the electrical pulse width the same. The PSO generator 60 may be arranged in a variety of ways, one of which is shown on a microstrip line 82 in FIG. 4.

The basic advantages of the PSO generator 60 arranged on the microstrip 82 (known in the art) have been demonstrated and which comprises two 50Ω charged transmission lines 62 and 64 that feed through the two BOSS switches 22A and 22B (embedded in the microstrip 82) into a single common 50Ω transmission line 70 that ultimately leads to either a matched load $R_L$, or to an antenna (not shown) if it is desired to radiate the RF energy. Making the two BOSS switches 22A and 22B attached to the same point of the common transmission line 70 greatly reduces the severity of reflections, to be further described, seen by the PSO generator 60 serving as a source. Therefore, the fidelity of the waveforms 74 and 76 of RF output signal 72 is enhanced. It is important to realize that the ability of the BOSS switches 22A and 22B to each open, thus interrupting the current, while voltage is left on the charged transmission lines 62 and 64, respectively, means that the impedance of the charged transmission line, such as 62 or 64, does not necessarily have to match the impedance of the common transmission line 70. Thus, if the impedance of the charged transmission line 62 or 64 was reduced to a value that was much less than the impedance of the common transmission line 70, then the voltage (+V(66) or −V(68)) delivered to the load $R_L$ would be roughly equivalent to the total charge voltage carried by charged transmission lines 62 and 64, respectively, rather than half of the charge voltage, as in the matched transmission line cases. This arrangement results in a factor of four increase in the power delivered to the load $R_L$ for a given charge voltage.

Figure 4:
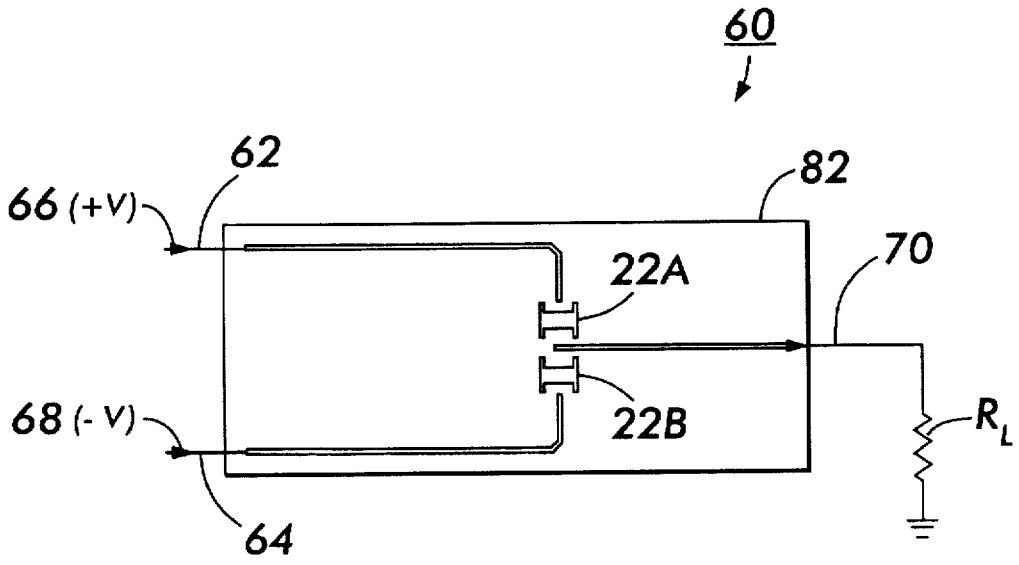
FIG. 4 illustrates a stripline configuration of the PSO generator of FIG. 3.

The PSO generator 60 of FIGS. 3 and 4 could also be used as a means for generating ac power to be delivered to any load. A possible example would be for use in a switching power supply. The PSO generator 60 could also be used in many high-speed diagnostic applications where both high and low power, high-bandwidth pulses are required. The PSO generator 60 has further applications to be described hereinafter.

TEST EVALUATION OF THE PHOTOCONDUCTIVE SWITCH OF THE PRESENT INVENTION

In the practice of the present invention, BOSS-switching experiments were conducted with a mode-locked Nd:YAG laser system producing a first laser beam having an operating wavelength of 1.06 μm and manufactured by Continuum Inc., that was equipped with an optical parametric generator (OPG), known in the art, which served to double the wavelength so as to provide a second laser beam having an operating wavelength of 2.13μm. Thus, two laser beams were provided. The first having an operating wavelength of 1.06 μm serving as laser beam 36 of FIG. 2(A) to turn-on (low resistance path) BOSS switch 22 and the second having an operating wavelength of 2.13 μm serving as laser beam 38 of FIG. 2(A) to turn-off (high resistance path) BOSS switch 22. A laser system 84 was used as a setup to test the BOSS switch 22 as shown in FIG. 5 and comprises a ND:YAG laser source 86 and an OPG 88.

The laser system 84 produced a Gaussian pulse with a FWHM of about 140 ps. A simple optical delay line (not shown in FIG. 5, but an optical delay line is to be described with reference to FIG. 10) was then used to adjust the time between the closure of BOSS switch 22 and the opening of BOSS switch 22. Photoconductivity measurements were performed to evaluate the operation of the neutron irradiated BOSS device 22 of the present invention. The BOSS switch 22 was embedded in a 50Ω transmission line 90 (two-way transit time ≈8 ns) that was pulse charged with roughly a 40 ns FWHM voltage pulse generated by a Klystron circuit 92 (known in the art) arranged as shown in FIG. 5. The maximum voltage applied to the BOSS switch 22 was about 18 kV. The current through the BOSS switch 22 was measured by a 50Ω current-viewing resistor (CVR) (not shown), known in the art, placed after the BOSS switch 22 in the 50Ω line 70. The current waveform was recorded by a Tektronix SCD5000 digitizer 94 having a 3.0 GHz analog/digital bandwidth. The results were also recorded on a conventional computer workstation 96.

Figure 6:
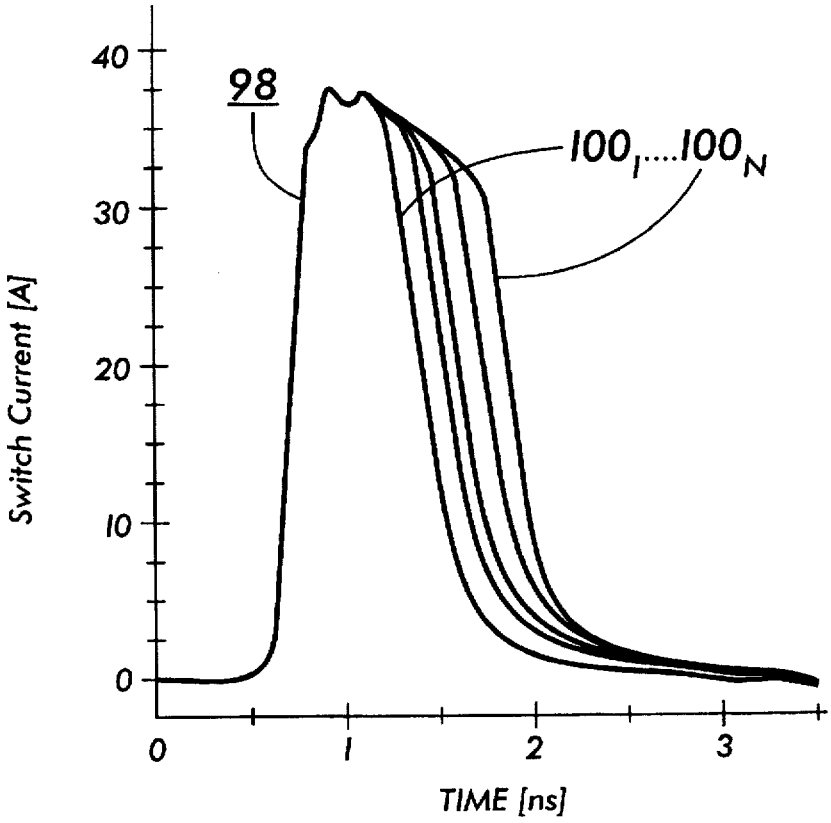
FIG. 6 illustrates the pulse-width agility achieved by varying the time delay between laser pulses directed onto the photoconductive switch of the present invention.

The experimental testing was performed on the two previously mentioned Samples A and B, with Sample A receiving a neutron irradiation of a fluence of $2.45\times10^{15}$ $cm^{12}$ and Sample B receiving a neutron irradiation of a fluence of $3.93\times10^{15}$ $cm^{-2}$. Switching results illustrating a photocurrent 98 for Sample A are shown in FIG. 6 for an applied voltage of 3.7 kV. The maximum voltage that was switched with this BOSS switch 22 was about 18 kV. This 18 kV value was caused by the bias-voltage modulator limitation of the test equipment, and not by the limitation of the BOSS switch 22. It is contemplated that switching voltages in the range of 25 kV to 50 kV should be possible with the neutron-irradiated BOSS switches 22 of the present invention. During our testing, the switching behavior of Sample A did not change as the applied voltage was increased.

Figure 5:
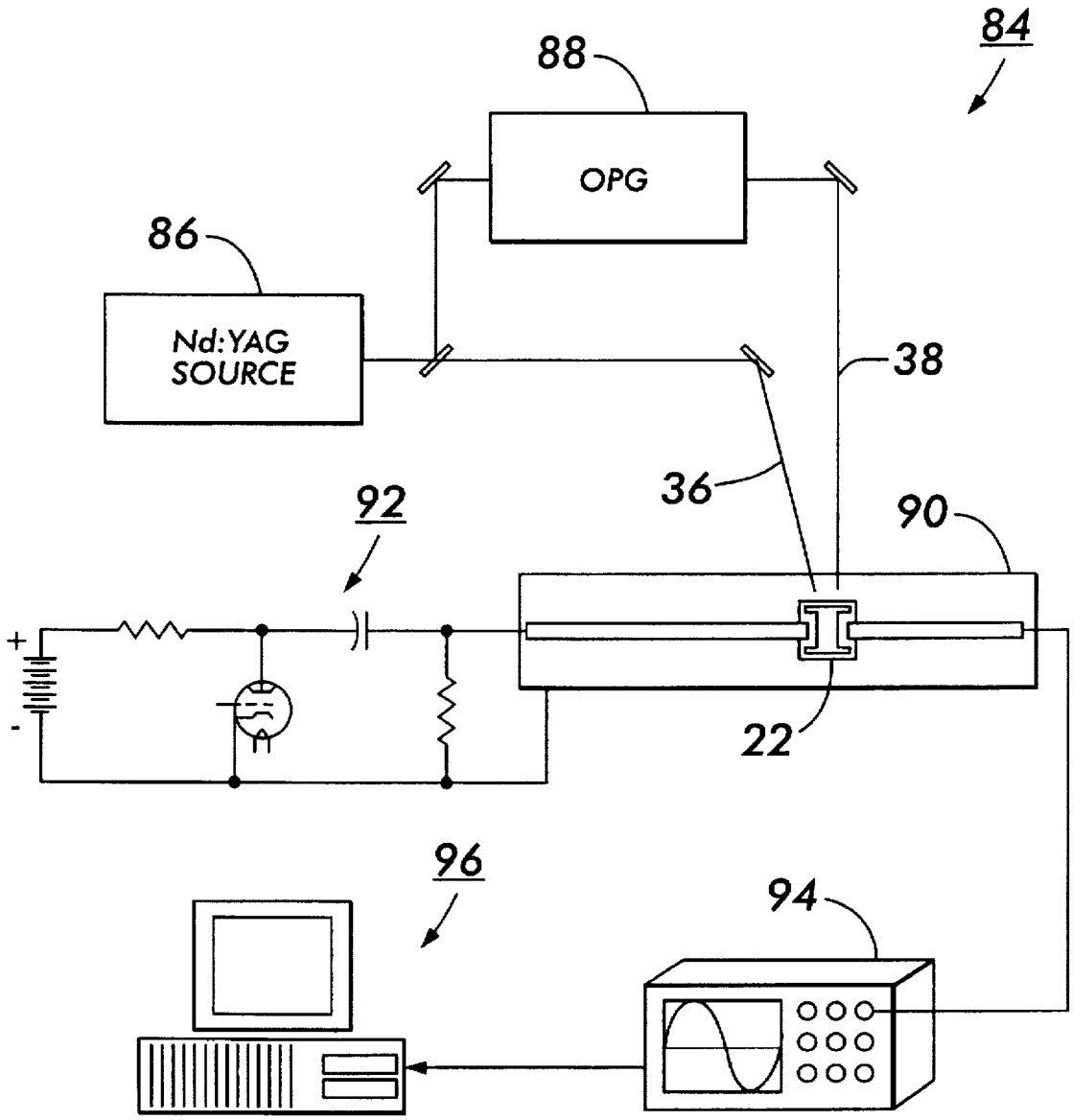
FIG. 5 is a schematic diagram of an experimental setup used in the practice of the present invention.

FIG. 6 shows several current waveforms $\mathbf{100}_1 \ldots \mathbf{100}_N$ superimposed on waveform 98 to demonstrate the ability to control the pulse width of the electrical pulse delivered to the 50Ω CVR of FIG. 5. The laser pulse energy for both the 1.06 μm and the 2.13 μm wavelengths, serving as laser beams 36 and 38, was set at 4.5 millijoules (mJ). The minimum switch resistance during the transient from the off-on states was measured to be ≦1Ω. The minimum pulse width achieved with the BOSS switch 22 was measured to be about 650 ps FWHM. A curve fit to the switch conductance during the opening phase, after it was extracted from the circuit load line (such as $R_L$ of FIG. 2), indicated a recombination time constant of 100 ps.

Figure 7:
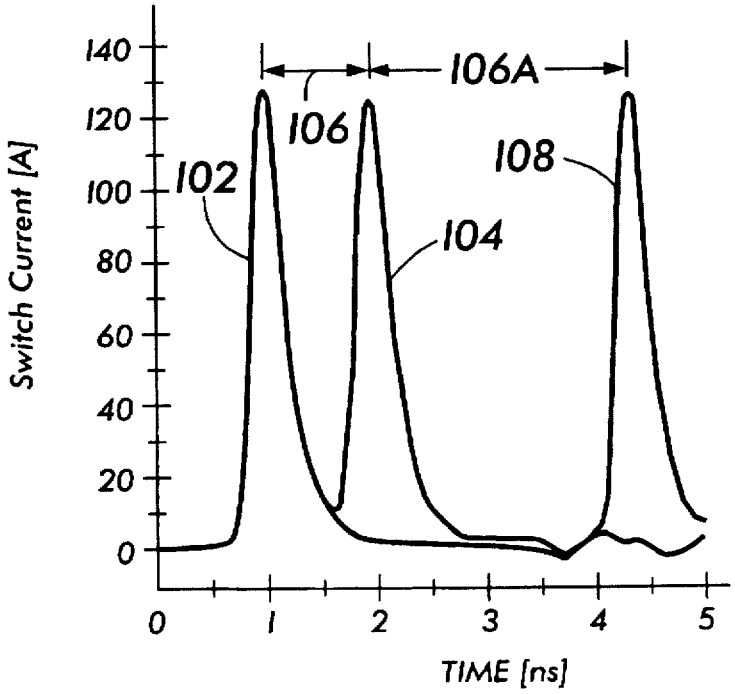
FIG. 7 illustrates various repetition rates, within a two-pulse burst, at an applied relatively high voltage in the range of about 16 kV.

Photoconductivity experiments were also conducted on Sample B having an increased ($3.93\times10^{15}$ $cm^{-2}$) fluence relative to Sample A ($2.45\times10^{15}$ $cm^{-2}$). One drawback of an increased fluence and, thus an increased density of recombination centers, is that the on-state conductivity is reduced because electrons in the conduction band 12 recombine with holes in the valence band 20 before those holes can be trapped in the $Cu_B$ center. This interaction of the electrons and holes of the bands 12 and 20 reduces the number of holes that are trapped in the $Cu_B$ center which, in turn, reduces the available sites to receive electrons from the valence band 20 during the turn-off laser pulse (laser beam 38 of FIG. 2(A)). However, a benefit can be derived if the density of recombination centers in the bulk material is made high enough to cause the BOSS switch 22 to open without the need of the turn-off laser beam 38. This effect is shown in FIG. 7 where two 1 μm laser pulses, shown as waveforms 102 and 104 in FIG. 7 but respectively equivalent to laser beams 36 and 38 of FIG. 2(A), were used to close Sample B (that is, obtain its low resistance state) at a high repetition rate. For these experiments, the BOSS switch 22 was only illuminated by two 1 μm laser pulses with a variable time delay between them shown in FIG. 7 by dimensional line 106. The reason why Sample B opened without the turn-off laser pulse was because it was irradiated at a higher neutron fluence than Sample A. Therefore, there was a higher density of recombination centers in the bulk material of Sample B than that of Sample A. The purpose of this experiment with Sample B was twofold, first to see how the BOSS switch 22 (Sample B) responded to the turn-on laser pulse (laser beam 36 of FIG. 2(A)), and secondly, to test the repetition rate capability of Sample B. The applied voltage that created pulses 102 and 104 shown in FIG. 7 was about 16 kV. The minimum on-state resistance that was measured for Sample B was about 15Ω. The average pulse width of both pulses 102 and 104 was measured to be about 340 ps. Further, the average pulse width of a third pulse 108, shown in FIG. 7 as being spaced apart from pulse 104 by dimensional line 106A, was about 340 ps. The time separation between the two laser pulses 102 and 104 or between 102 and 108, was varied from about 3.5 ns, corresponding to a repetition rate of roughly 285 MHz, down to less than 1 ns, corresponding to a repetition rate of greater than 1 GHz. These repetition rates are basically four to five orders of magnitude higher than used in the operation of any other type of high-power photoconductive switch known to us.

The maximum voltage that was switched with Sample B was 18 kV, yielding an average electric field of 36 kV/cm. Again, this bias voltage (18 kV) was limited by the bias-voltage modulator of the test equipment, rather than a physical limitation of the BOSS switch 22. It is important to note that there was no indication of Sample B collapsing into a filamentary-current mode of conduction, known in the art, at any point in the switching cycle. This non-collapse is significant since almost all previously reported photoconductive switch experiments exhibit a transition into filamentary conduction, or lock-on, at average electric fields of ≧10 kV/cm. A previously reported transition into filamentary conduction is disclosed by F. J. Zutavern and G. M. Loubriel, in the technical article "High-Power Optically Activated Solid-State Switches," A. Rosen and F. Zutavern, Eds., Boston: Artech House, 1994, Chapter 11, and herein incorporated by reference. One of the most striking, attributes of the current pulses 102, 104 and 108 is that the BOSS switch 22 (Sample B) completely opens without the need of the 2 μm laser pulse that would serve as laser beam 38 previously discussed with reference to FIG. 2(A).

Figure 8:
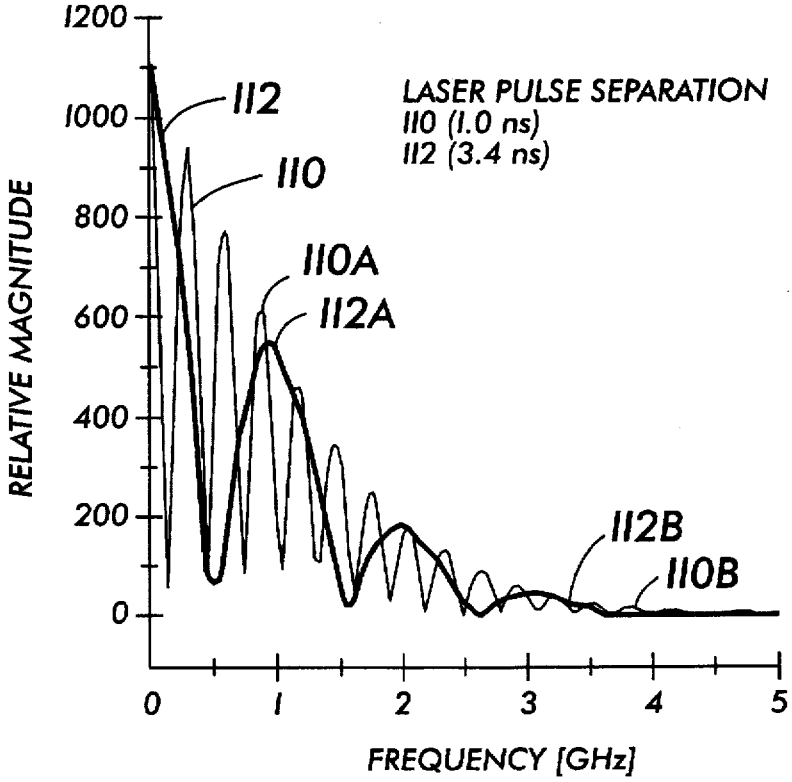
FIG. 8 illustrates a Fourier spectra of the waveforms of FIG. 7.

Since one of the potential applications of a BOSS switch 22 is in an impulse or ultra-wide-band (UWB) radar, we wanted to examine the Fourier spectra of the waveforms in FIG. 7. The results of performing a 4096-point fast fourier transformation (FFT) on the data in FIG. 7 are shown in FIG. 8. FIG. 8 illustrates two plots 110 and 112, with plot 112 having the wider spacing of its peaks. FIG. 8 shows significant frequency content up to about 3 GHz which was the bandwidth limit of the SCD5000 digitizer 94 of FIG. 5. The result of adjusting the delay between the two pulses 110 and 112 (respectively serving as laser beams 36 and 38 of FIG. 2(A)) can be seen as a change in the number, and location, of the nulls in the spectra. For example, by changing the time delay from 1 ns to 3.4 ns, the spectral peak of 1 GHz is changed to a null. More particularly, and with reference to FIG. 8, if the time delay is changed from 1 ns to 3.4 ns, the peaks 110A and 112A at 1 GHz for plots 110 and 112, respectively, move to locations (valleys) generally indicated by reference numbers 110B and 112B respectively. The capability to change the generated spectrum by simply changing the optical delay between laser pulses 110 and 112 (more particularly, laser beams 36 and 38 of FIG. 2(A)) could be very useful in UWB radar applications, particularly if certain frequency bands are to be avoided.

The stripline configuration of the PSO source 60 of FIG. 4 was also experimentally tested in the practice of this invention. As previously described, the PSO generator 60 has two separate BOSS switches 22A and 22B connected at the same point (common transmission line 70) on the stripline 82 so that there will not be any current reflections off of the opened BOSS switch 22A or 22B when the other BOSS switch 22B or 22A is closed. It should be noted that when one of the BOSS switches 22A or 22B of FIG. 4 is closed, the potential across the other BOSS switches 22B or 22A is doubled, assuming that both BOSS switches 22A and 22B are biased at equal values with opposite polarities 66 and 68. Therefore, the BOSS switches 22A and 22B in the PSO configuration 60 of FIG. 4 should be able to withstand voltages that are twice as high as the charge voltage, carried by charged transmission lines 62 and 64, on the BOSS switches 22A and 22B. The severity of this problem is limited since each BOSS switch 22A or 22B is only closed for less than one or two nanoseconds.

During our experimental testing, the PSO source 60, shown in FIG. 4, was also biased with a 40 ns voltage pulse generated by the Klystron circuit 92 of FIG. 5. However, the output of the Klystron circuit 92 had to be divided between the positive and negative striplines, that is, transmission lines 62 and 64 shown in FIG. 4. Therefore, the maximum voltage that could be applied to each BOSS switch 22, during our experimental testing, was about 10 kV.

Experiments were performed with two Sample B devices embedded in the PSO generator 60 shown in FIG. 4. As previously discussed, the Sample B devices, now to be described as BOSS switches 22A and 22B of FIG. 4, were neutron irradiated at a relatively high fluence of $3.93\times10^{15}$ $cm^{-2}$. These BOSS switches 22A and 22B were biased with a 40 ns voltage pulse with a maximum amplitude of about 9.5 kV. Since these BOSS switches 22A and 22B were self opening (as previously discussed for Samples B), only the 1 μm wavelength was used for the PSO generator 60 demonstration.

Figure 9:
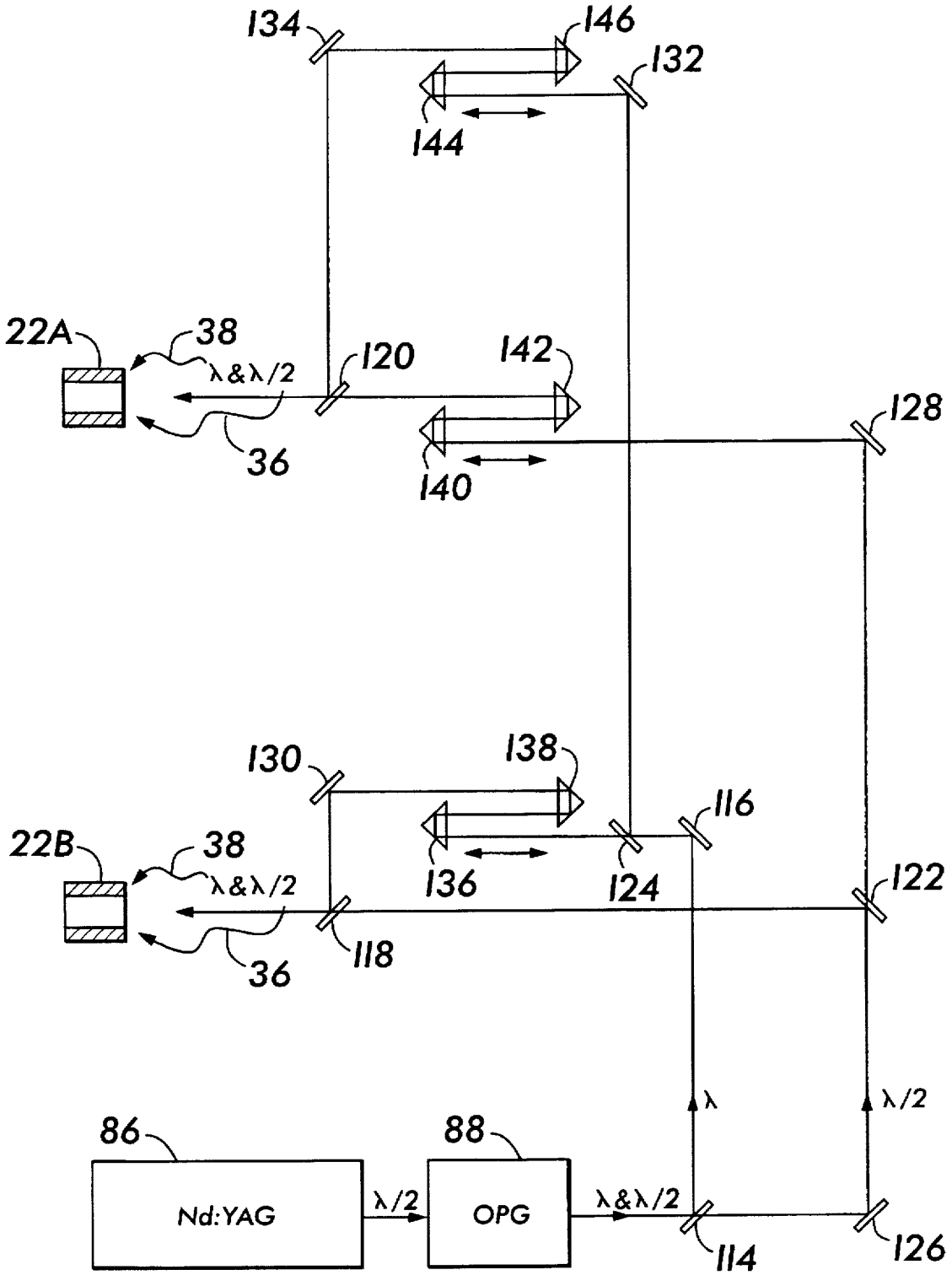
FIG. 9 primarily illustrates an optical delay line used in the evaluation of the photoconductive switches of the present invention.

A special optical delay line was set up which divided 1 μm and 2 μm laser pulses into two pulses, each with one half of the total energy transmitted by the laser source 86, previously mentioned with reference to FIG. 5. This optical circuit depicted in FIG. 9 takes both the fundamental (1 μm) and the wavelength-doubled (2 μm) laser pulses out of the OPG 88, previously mentioned with reference to FIG. 5, and delivers them to the two BOSS switches 22A and 22B in the PSO generator 60 in such a way as to permit easy adjustment of the optical paths. For the arrangement shown in FIG. 9, the 1 μm pulse is shown as wavelength λ/2 and the 2 μm pulse is shown as wavelength λ. Dichroic mirrors 114, 116, 118 and 120, arranged as shown in FIG. 9, were used to separate the two wavelengths (λ and λ/2), and 50:50 beam splitters 122 and 124 were used to make a second set of laser pulses (λ and λ/2). The optical delay line was further fitted with mirrors 126, 128, 130 and 134 arranged as shown. Optical rails comprising elements 114, 116 . . . 132 were further fitted with 180° turning prisms 136, 138, 140, 142, 144 and 146, having anti-reflection coatings thereon to minimize the optical losses, which allowed a laser-pulse separation (λ and λ/2) to be more easily adjusted. The optical rails depicted in FIG. 9 could be replaced by computer-controlled optical devices.

Figure 10:
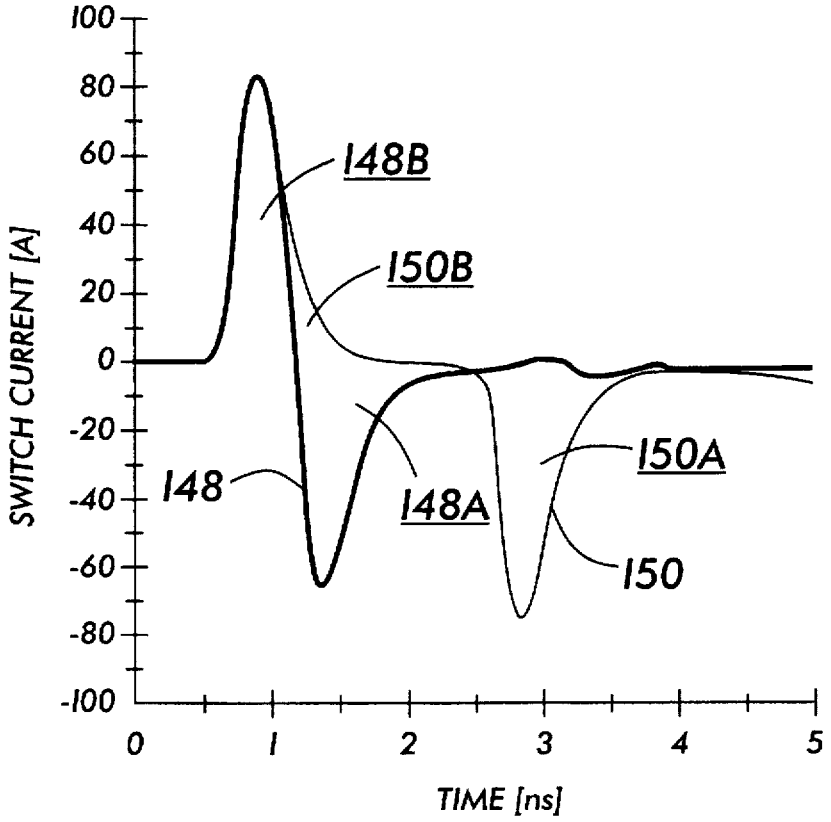
FIG. 10 illustrates two bipolar pulses produced by a PSO generator of FIGS. 3 and 4.

For the arrangement of FIG. 9, the first laser pulse 36, previously described with reference to FIG. 2(A), is shown as λ/2 and the second laser pulse 38, also previously described for FIG. 2(A), is shown as λ. The setup shown in FIG. 9 could be configured either to create a single switching event with a variable delay between the turn-on and turn-off laser pulses 36 and 38, or to create a two-pulse burst by repetitively switching a single BOSS switch 22A or 22B. In the second case, a first BOSS switch, such as 22A could be switched at repetition rates as high as 1 GHz within a two-pulse (36 and 38) burst. With this setup, the second BOSS switch, such as 22B can be closed at any time relative to the first BOSS switch 22A. This includes closing the second BOSS switch 22B before the first BOSS switch 22A is opened. The time-domain waveforms for a time delay between the 1 μm laser pulses (serving as laser beam 36) of about 500 ps and about 2 ns are shown in FIG. 10 respectively by waveforms 148 and 150, with waveform 148 being represented by the darker lines therebetween. The time delay of about 500 ps resulted in the formation of a single RF cycle (indicated as 148), or monocycle, with a duration of a little over 1 ns. There is a considerable amount of pulse sharpening of waveform 148 of the positive half-cycle thereof that occurs as a result of the second BOSS switch 22B closing prior to the complete recovery (obtaining its high resistance state) of the first BOSS switch 22A. This effect occurs because the opposite polarity of the charge voltage, that is, the voltage carried by charge transmission lines 62 and 64, results in a cancellation of the voltage that is actually delivered to the CVR, previously discussed with reference to FIG. 5. The advantage of this overlapping method of operating of the two separate BOSS switches 22A and 22B is that slightly higher frequencies, relative to the non-overlapping operation, can be obtained. However, the voltage cancellation also reduces both the peak amplitude of the negative half-cycle, such as 148A, as well as the total energy contained in the positive half-cycle, such as generally indicated as 148B. The peak amplitude imbalance can be corrected by biasing the second BOSS switch 22B it a slightly higher negative voltage than the first BOSS switch 22A. When the laser time delay is increased to about 2 ns, the actual response of the first BOSS switch 22A, represented by waveform 150, is measured, as shown in FIG. 10. In a manner similar to that of waveform 148, waveform 150 has a negative half-cycle 150A and a positive half-cycle 150B. For the case of waveform 150, the negative half-cycle 150A is roughly the mirror image of its positive half-cycle 150B. The remaining differences in the peak amplitudes are the result of the bias-voltage modulator of the test equipment of FIG. 9, rather than the operation of the BOSS switches 22A and 22B.

Figure 11:
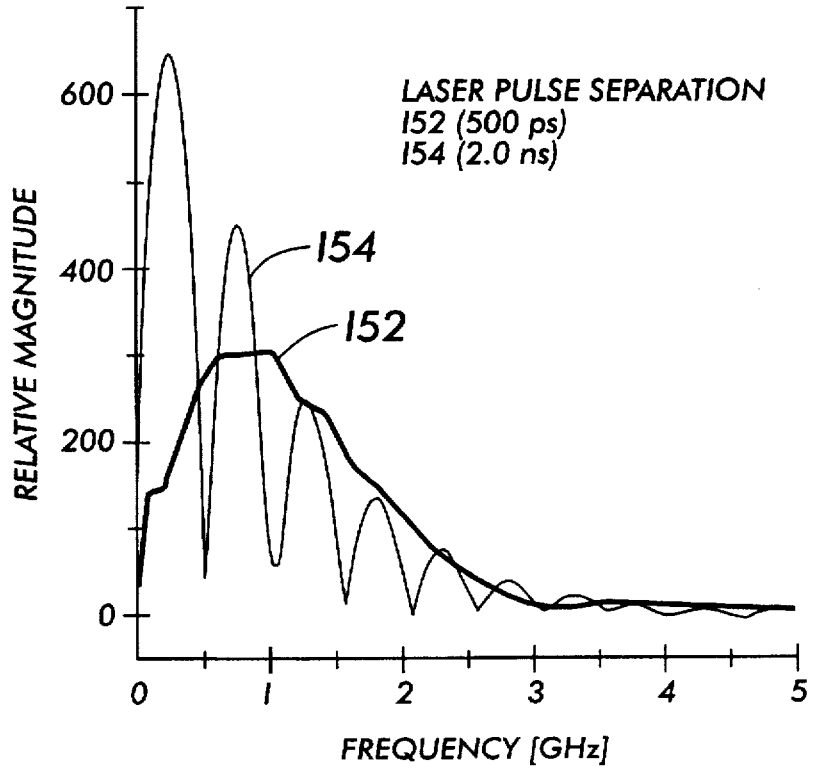
FIG. 11 illustrates the Fourier spectra of the two bipolar pulses of FIG. 10.

The ability to vary the time between the positive and negative half-cycles has a dramatic effect on the spectrum of the waveform. Several important characteristics of the Fourier spectra, obtained from the waveforms in FIG. 10, are illustrated in FIG. 11 for waveforms 152 and 154. First, unlike the spectra shown in FIG. 8, related to the laser pulse separation of 1 ns and 3.4 ns, the spectra in FIG. 11, related to the laser pulse separation of 500 ps (waveform 152) and 2.0 ns (waveform 154), contain a significantly reduced dc component. As mentioned earlier with reference to the PSO generator 60 of FIGS. 3 and 4, a reduction in the dc component will greatly increase the ability to radiate the pulse, generated by the operation of BOSS switches 22A and 22B, out of an antenna. Secondly, there is a drastic effect on the spectrum of the bipolar pulse when cross-over distortion is intentionally created. The spectrum associated with the undistorted monocycle represented by waveform 152 has a bandwidth of roughly 150%. In other words, dividing the FWHM of the spectrum, which is about 1.5 GHz, by the center frequency of the spectrum, which is about 1 GHz, yields a bandwidth of 1.5. Notice that it is difficult, it not impossible, to apply the same definition of spectral bandwidth to the case when there is a 2.0 ns separation between the positive and negative half-cycles, as shown for the waveform 154 of FIG. 11.

As previously discussed with reference to FIG. 8, and as now illustrated in FIG. 11, varying the time delay between the positive and negative half-cycles of each waveform 152 or 154, changes the number and location of the nulls in the spectrum. Also, since the energy in the pulse should be conserved, increasing the number of nulls, by increasing the time delay between the half-cycles, results in a higher power-spectral density in the peaks of the spectrum. This is shown in FIG. 11, where the relative magnitude of the lower-frequency peaks of the distorted waveform 154 are more than a factor of two greater than the peak of the spectrum associated with the monocycle 152. Note that, after further analysis, a slight increase in the energy associated with the distorted waveform 154 is expected due to the lack of cancellation of part of the positive half-cycle. The dominant mechanism for the increased lower frequency content is associated with a reduction of the fundamental frequency of the waveform. The fundamental frequency is basically a sinewave with its positive and negative peaks coincident with the positive and negative peaks of the distorted waveform 154. For example, in FIG. 11, the distorted waveform 154 has a 2 ns separation between the positive and negative peaks. This separation would therefore result in a fundamental frequency of 250 MHz, which corresponds to the first peak of waveform 154 in the spectrum, as shown in FIG. 11.

Figure 12:
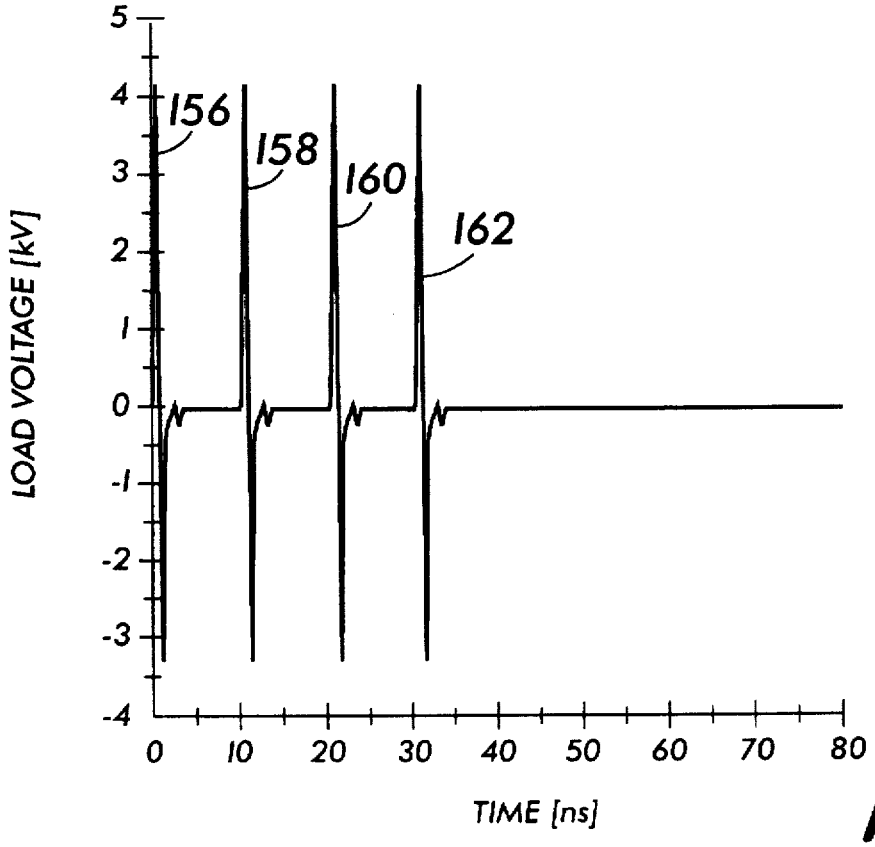
FIG. 12 illustrates replicating data similar to that shown in FIG. 10.

The high repetition rates of the PSO generator 60 were not fully tested, by the practice of our invention because of the limitation of our test equipment. However, since the operation of the BOSS switch 22 was demonstrated at about 1 GHz, in a burst mode, and since the operation of two BOSS switches 22A and 22B in a PSO generator 60, such as that of FIGS. 3 and 4, has also been demonstrated, it is reasonable to examine the effect of generating a short burst of RF cycles of megahertz repetition rates. To accomplish this, a potential RF output from a PSO generator 60 was simulated by replicating data similar to that shown in FIG. 10 for a laser pulse separation of 500 ps, and a time separation between RF cycles of 1 ns. The result of this data manipulation is shown in FIG. 12 where four RF cycles, shown as waveforms 156, 158, 160 and 162 (each having positive and negative peaks), at a 100 MHz repetition rate, are illustrated within a total time window set at 80 ns. FIG. 12 is an illustration of the type of waveforms that are actually expected to be generated by PSO generator 60.

Figure 13:
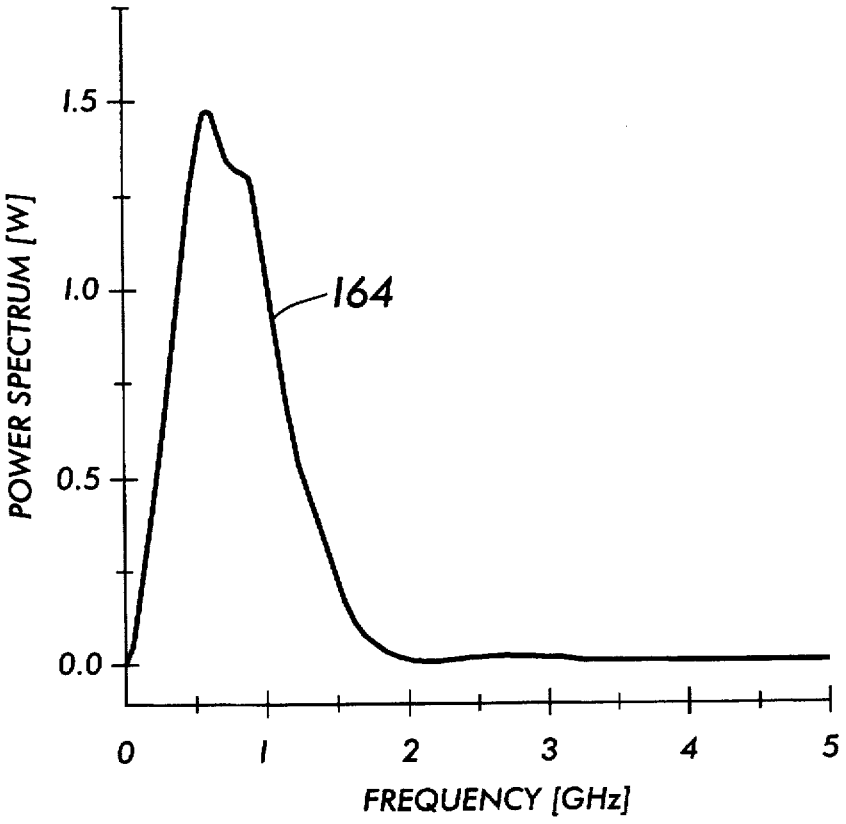
FIG. 13 illustrates a power spectrum of a single monocycle waveform having a repetition rate of 1 kHz.
Figure 14:
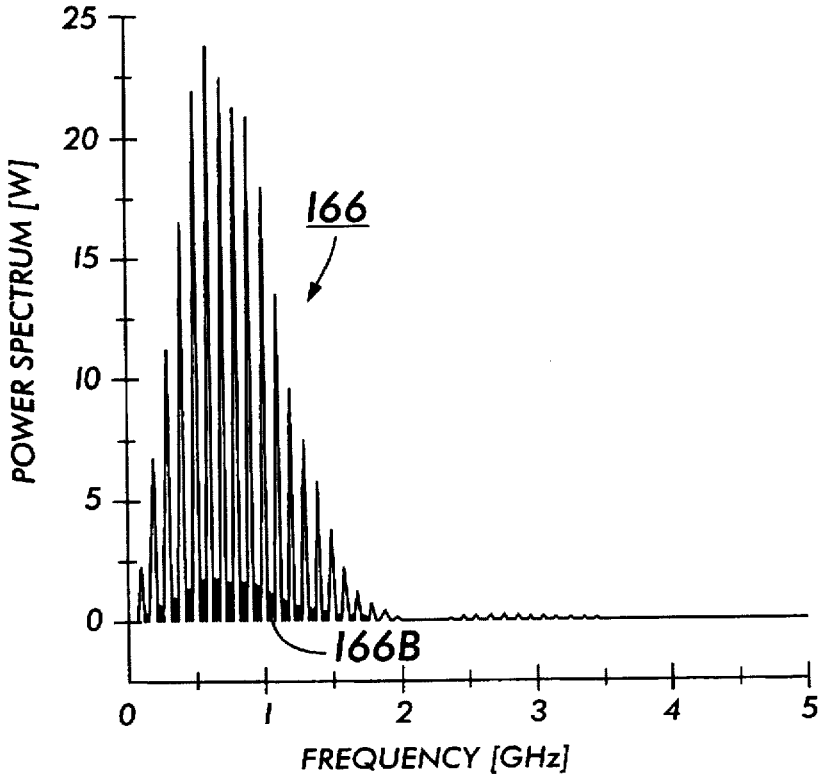
FIG. 14 illustrates a power spectrum of the waveforms of FIG. 12 having a 1 kHz burst-repetition rate.

The power spectra of a single monocycle, such as waveform 152 of FIG. 11, as well as the waveforms 156, 158, 160 and 162 shown in FIG. 12, corrected for a burst repetition rate of 1 kHz, are illustrated in FIGS. 13 and 14, respectively for waveforms 164 and waveform 166 (shown in a cluster manner). The method by which the power spectrum shown in both FIGS. 13 and 14 was calculated was by first performing a fast fourier transform (FFT) on the time-domain waveforms of FIGS. 13 and 14 of the corresponding voltage on a 50-Ω load, such as $R_L$ of FIG. 3. The data was then padded, as known in the art, with zeros so that the total time window of 80 ns (see FIG. 12) corresponded to a 12.5 MHz burst repetition rate, as far as the FFT was concerned. The amplitude of the resulting frequency-domain data of FIGS. 13 and 14 was determined in units of volts. To obtain the power spectrum in the 50Ω load, the amplitude was squared and subsequently divided by 50. The resulting spectral amplitude could now be expressed in units of watts, however, this amplitude also corresponds to the 12.5 MHz repetition rate. To scale the data for a 1 kHz repetition rate (such as that shown in FIG. 13), the data was multiplied by the square of the ratio of 1 kHz over 12.5 MHz, or by a factor of $6.4\times10^{-9}$.

The spectrum for the single monocycle, shown in FIG. 13 as waveform 164, has a maximum amplitude of about 1.5 watts. However, as a result of the 10 ns spacing between the RF cycles as shown in FIG. 14, the spectrum for the four-pulse burst, shown in FIG. 14 by cluster waveform 166, is further subdivided into peaks which occur every 100 MHz. As a result of the increased number of nulls in the spectrum (generally shown by dark valleys indicated as 166B), the power spectrum at each one of the peaks is increased considerably. In fact, the peak power increased from 1.5 watts (FIG. 13) to about 24 watts (FIG. 14), or a factor of 16. There are basically two reasons for this increase in the power spectrum. First, since the power spectrum for both the monocycle (FIG. 13) and the four-pulse burst (FIG. 14) were calculated for a 1 kHz repetition rate, the total energy in the four-pulse burst (FIG. 14) is a factor of four higher than the monocycle (FIG. 13). The other factor of four comes from the subdivision of the spectrum into discrete peaks at every 100 MHz as generally indicated in FIG. 14. In a similar manner, if ten pulses were generated within a single burst, the peak of the power spectrum would be increased by a factor of 100. A higher number of cycles in the burst would also have the effect of reducing the width of each one of the 100 MHz peaks.

Figure 15:
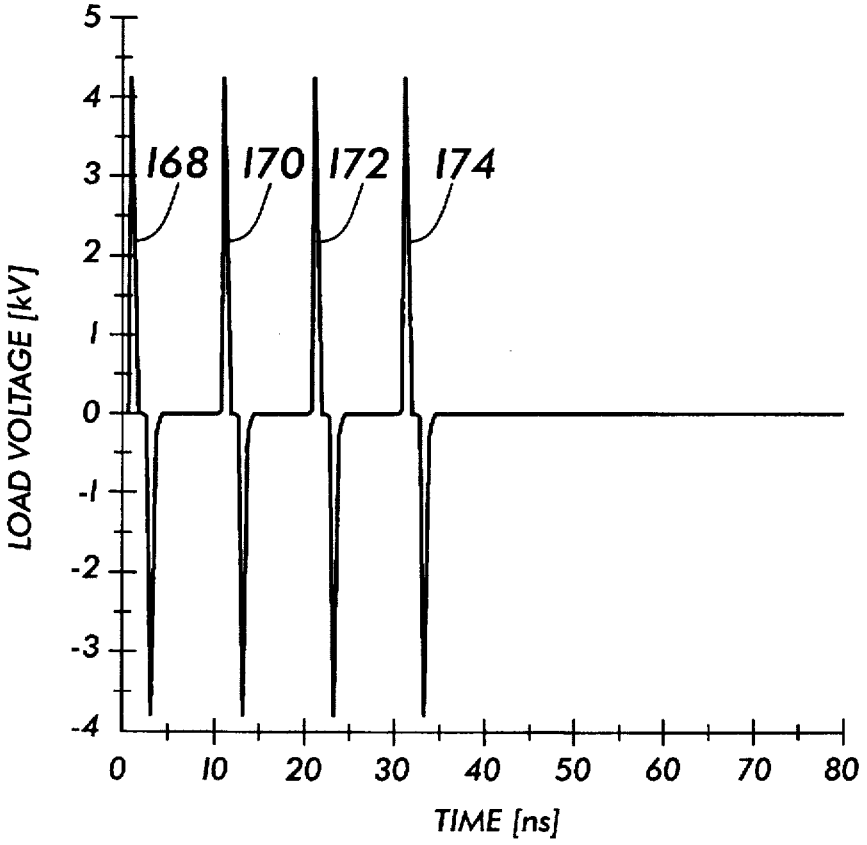
FIG. 15 illustrates replicating data of the bipolar pulses shown in FIG. 10.
Figure 16:
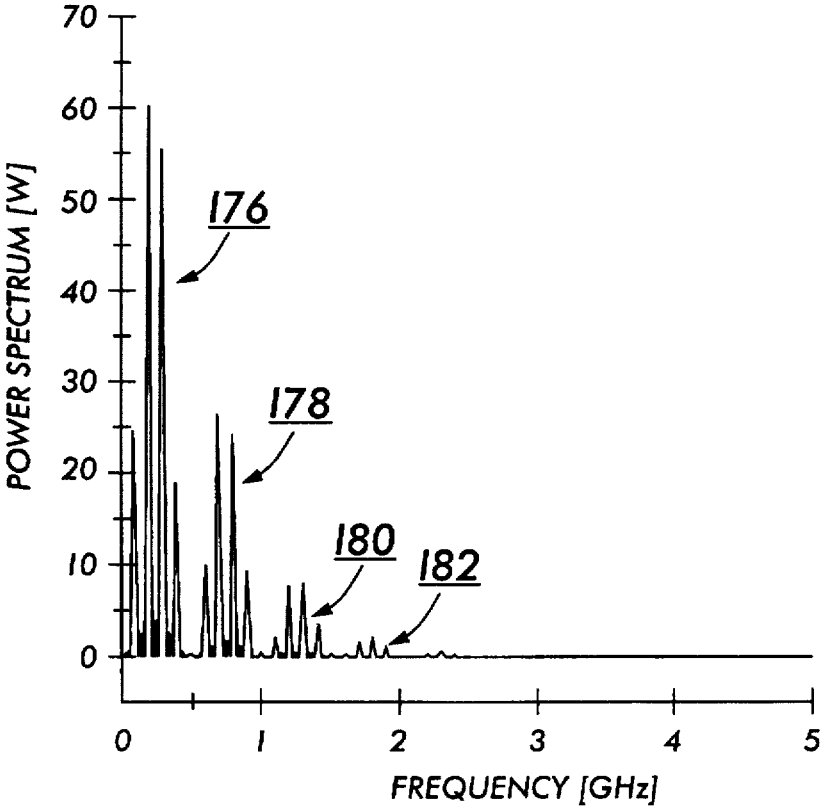
FIG. 16 illustrates a power spectrum of the waveforms of FIG. 15 having a 1 kHz burst-repetition rate.

The same type of results are obtained when using the waveform distorted by separating the positive and negative half cycles, as shown in FIG. 15, to fabricate the four-pulse 168, 170, 172 and 174 (each having positive and negative peaks) burst. Note that this distortion results in an additional increase in the peak of the power spectrum, at lower frequencies, as shown in FIG. 16, wherein the lower frequency burst, such as pulse 176, has a peak which is greater than the higher frequency pulse, such as pulse 182. These results indicate that the time delay between the positive and negative half-cycles dictates the shape of the envelope of the spectrum, while the cycle repetition rate within the burst dictates the placement of the various spectral peaks. The type of waveforms shown in FIGS. 12 and 15, respectively, may have considerable advantages for use in UWB-radar and other high-power microwave (HPM) generation applications.

It should now be appreciated that the present invention provides a BOSS switch that is able to transient from its on (closed) to off (open) state in the subnanosecond regime as presented in FIGS. 6 and 7. The ability to open, that is, obtain a high resistance state, in the subnanosecond regime is achieved by enhancing the recombination center density in the bulk material through fast-neutron irradiation.

An additional benefit of neutron irradiation in bulk photoconductive switches, such as BOSS switch 22, is that it allows the operation of these devices at voltage levels far greater than that possible in non-irradiated devices. The high level operation is primarily achieved by the enhanced speed of response of the neutron irradiated BOSS switch 22. Therefore, the neutron irradiation can be used as a means of preventing, or increasing the threshold voltage for, the development of a breakdown of the BOSS switch which results in the formation of current filaments known in the art. Thus, the power-handling capability of the BOSS switch is increased.

It should be recognized that an additional benefit can be derived from irradiating GaAs:Si:Cu with neutrons if the neutron fluence is elevated to a level that is high enough to create a sufficient number of recombination centers such that the BOSS switch will open back up following the termination of the turn-on, or 1 μm, laser pulse. This effect has been demonstrated in FIG. 7. Furthermore, it has been demonstrated that the ability to open a BOSS switch in the subnanosecond regime also allows the repetitive operation of the BOSS switch to be in the gigahertz regime, also shown in FIG. 7.

It has been demonstrated that neutron irradiation allows a BOSS switch to be manufactured that is suitable for implementing the pulse-switch-out (PSO) generator illustrated in FIGS. 3 and 4. The PSO generator has the distinct advantage of being able to change the radiated frequency, in a very short time period, simply by varying the optical delays of the laser pulses used to control the switches. One example of a suitable optical circuit that permits real-time tunability of the PSO RF source is depicted in FIG. 9.

It should be further appreciated that the PSO configuration depicted in FIGS. 3 and 4 has the ability to control both the number and location, in frequency, of the nulls in either the radiated spectrum or the spectrum of the waveform delivered to a load through a transmission line. The PSO generator acting as a source also allows the amplitude of the spectral peaks to be adjusted by varying the optical path lengths taken by the various laser pulses that are used to turn-on and turn-off the BOSS switch of the present invention. The laser source used to control the PSO generator can have a significant effect on the radiated spectrum by controlling the number of cycles contained in the burst of RF energy. And, since the BOSS switch 22 of the present invention has virtually no jitter, the coherence of the radiated waveform is controlled by the laser system. If the laser pulses used to control the PSO generator, more particularly the BOSS switches of the PSO generator, are coherent in time, then the radiated RF waveform will also be coherent in time. The ability to control the spectrum in this manner as provided by the present invention may offer considerable advantages in many applications including, but not limited to, wide-band radar, ultra-wide-band (UWB) radar, high-resolution radar, coherent radar, ground-penetrating radar, foliage-penetrating radar, impulse radar, electronic counter measures (ECM), electronic counter-countermeasures (ECCM), electronic warfare (EW), spread-spectrum communications, and high-power microwave (HPM) generation.

Although neutron irradiation has been described for enhancing the recombination centers of the BOSS switches, other methods could be used for recombination-center generation in GaAs:Si:Cu material. These methods include high-energy charged-particle irradiation, such as using electrons or ions. It may also be possible to grow the bulk GaAs material with a higher recombination-center density.

The PSO generator could also be implemented with photoconductive devices that are not based on GaAs:Si:Cu. Other materials could be used to implement the PSO generator, provided their electron-hole lifetime is short enough, including GaAs, InP, CdS, SiC, AlGaAs, HgTe, CdTe, ZnSe, Si, diamond (C) and GaN. The electrical pulse widths generated by these devices could possibly not be precisely controlled, as in the case of GaAs:Si:Cu, however, there could still be a considerable amount of frequency agility if devices manufactured from these materials were self-opening in the subnanosecond regime.

Numerous other variations and modifications of the present invention may be readily apparent to those skilled in the art in light of the above teachings. It is therefore to be understood that, within the scope of the appended claims, the invention may be practiced other than as specifically described herein.

What we claim is:

1. A photoconductive switching device having a predetermined recombination center density created by neutron irradiation defined by a predetermined range of fluence from about $2.5\times10^{15}$ $cm^{-2}$ to about $4\times10^{15}$ $cm^{-2}$, said photoconductive switching device having closed low electrical resistance and opened high electrical resistance states, wherein the opened state is achieved within a time of less than one nanosecond in response to the application thereon of a light pulse.

2. The photoconductive switching device according to claim 1, wherein said device comprises GaAs:Si:Cu and has a bandgap of 1.42 eV.

3. The photoconductive switching device according to claim 2, wherein said copper, Cu, forms a deep acceptor level $Cu_B$ in said GaAs at an energy level of about 0.44 eV above a valence band of said device.

4. The photoconductive switching device according to claim 2, wherein said device has a Fermi level and a recombination center at or above said Fermi level.

5. The photoconductive switching device according to claim 2, wherein said device has a density of recombination centers in the range from about $5\times10^{15}$ $cm^{-3}$ to about $5\times10^{16}$ $cm^{3}$.

6. The photoconductive switching device according to claim 2, wherein said device has operatively connected electrical-contact gaps at opposite ends, each having a length in the range from less than about one micrometer to greater than about one centimeter.

7. The photoconductive switching device according to claim 6, wherein said electrical-contact gaps are located at opposite ends of the same surface.

8. The photoconductive switching device according to claim 6, wherein said device has an exposed region located between said electrical-contact gaps and arranged to receive light.

9. The photoconductive switching device according to claim 8, wherein said light comprises first and second beams respectively having first and second wavelengths, with the second wavelength being longer than the first wavelength.

10. The photoconductive switching device according to claim 9, wherein said first and second wavelengths are respectively about 1 and 2 micrometers.

11. A method of enhancing the speed of response of photoconductive switching device from its low to its high electrical resistance state in response to the presence of photon energy, said photoconductive switch device comprising a GaAs:Si:Cu material formed by a process of thermally diffusing said Cu into said GaAs, said method comprising:

(a) exposing said thermally diffused GaAs:Si:Cu material to a predetermined intensity of neutron radiation defined by a predetermined range of fluence.

12. The method according to claim 11 further comprising:

(b) forming an electrical contact at opposite ends of the same surface of said thermally diffused GaAs:Si:Cu material and repeating step (a) before and after step (b).

13. The method according to claim 11, wherein said predetermined range of said fluence is from about $2.5\times10^{15}$ $cm^{-2}$ to about $4\times10^{15}$ $cm^{-2}$.

14. The method according to claim 11, wherein neutron irradiation is supplied from a source having an energy spectrum from about 10 keV to about 1 MeV.

15. The method according to claim 11, wherein said thermally diffused GaAs:Si:Cu material is held at a temperature less than 100° C. during said neutron irradiation.

16. A pulse-switch-out generator comprising:

(a) a first photoconductive switching device having on and off high electrical resistance states and comprising a GaAs:Si:Cu material, wherein said Cu has a deep acceptor level $Cu_B$ in said GaAs at an energy level of about 0.44 eV above a valence band of said device and a Fermi level which is above the deep acceptor level $Cu_B$, said first photoconductive switching device having operatively connected electrical contact gaps at respective opposite ends thereof and an exposed region located between said electrical-contact gaps arranged to receive light, one of said contacts arranged to receive an input signal and the other of said contacts arranged to provide an output signal from said first photoconductive switching device;

(b) a second photoconductive switching device having on and off high electrical resistance states and comprising a GaAs:Si:Cu material, wherein said Cu has a deep acceptor level $Cu_B$ in said GaAs at an energy level of about 0.44 eV above a valence band of said device and a Fermi level which is above the deep acceptor level $Cu_B$, said second photoconductive switching device having operatively connected electrical contact gaps at respective opposite ends thereof and an exposed region located between said electrical-contact gaps and arranged to receive light, one of said contacts arranged to receive an input signal and the other of said contacts arranged to provide an output signal from said second photoconductive switching device;

(c) first means for connecting said input contact of said first photoconductive switching device to a relatively high positive potential;

(d) second means for connecting said input contact of said second photoconductive switching device to a relatively high negative potential;

(e) third means for connecting together each of said output contacts of both of said first and second photoconductive switching devices; and (f) means for directing first and second light pulses having different operating wavelengths onto each of said exposed region of each of said first and second photoconductive switching devices so that each of said first and second photoconductive switching devices transitions from its off-on and on-off electrical resistance states respectively in response to said first and second light pulses.

17. The pulse-switch-out generator according to claim 16, wherein each of said first and second photoconductive switches has recombination centers formed by neutron irradiation and having a density within a predetermined range.

18. The pulse-switch-out generator according to claim 16, wherein said high positive and high negative potentials can be as high as on the order of about 20 kV.

19. The pulse-switch-out generator according to claim 16, wherein said first and second light pulses comprise coherent light having operating wavelengths, with the second wavelength being longer than the first wavelength.

* * * * *